(12) United States Patent
Azinger

(10) Patent No.: US 6,525,525 B1
(45) Date of Patent: Feb. 25, 2003

(54) OSCILLOSCOPE WITH SIMPLIFIED SETUP PROCEDURE, AND PROCEDURE FOR SETTING UP OSCILLOSCOPE

(75) Inventor: Frederick A. Azinger, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/563,103

(22) Filed: May 2, 2000

(51) Int. Cl.7 ............................................. G01R 13/20
(52) U.S. Cl. ................. 324/121 R; 324/76.12
(58) Field of Search ................. 324/121 R, 112, 324/76.13, 76.11, 76.12; 345/340; 702/66, 67, 68

(56) References Cited

U.S. PATENT DOCUMENTS

| | | | |
|---|---|---|---|
| 4,974,167 A | * 11/1990 | Anderson et al. | 364/487 |
| 5,039,937 A | 8/1991 | Mandt et al. | |
| 5,072,168 A | 12/1991 | Ferguson | |
| 5,138,252 A | 8/1992 | Ferguson | |
| 5,155,431 A | 10/1992 | Holcomb | |
| 5,293,122 A | 3/1994 | Cake et al. | |
| 5,295,080 A | 3/1994 | Averill | |
| 5,375,067 A | * 12/1994 | Berchin | 364/487 |
| 5,397,981 A | 3/1995 | Wiggers | |
| 5,495,168 A | 2/1996 | de Vries | |
| 5,517,105 A | * 5/1996 | Holzwarth | 324/121 R |
| 5,742,276 A | * 3/1998 | Taraki | 345/134 |
| 5,923,161 A | * 7/1999 | Farnkovitch, Jr. et al. | 324/115 |
| 6,195,617 B1 | * 2/2001 | Miller | 702/125 |
| 6,229,536 B1 | * 5/2001 | Alexander et al. | 345/340 |

FOREIGN PATENT DOCUMENTS

| | | |
|---|---|---|
| EP | 0349328 A2 | 1/1990 |
| EP | 0756176 A2 | 1/1997 |

* cited by examiner

*Primary Examiner*—Michael Sherry
*Assistant Examiner*—Paresh Patel
(74) *Attorney, Agent, or Firm*—John Smith-Hill; Thomas F. Lenihan

(57) ABSTRACT

A method of operating an oscilloscope includes acquiring waveform data using a group of default acquisition parameters, analyzing the acquired waveform data in accordance with a selected one of several rule sets and deriving an optimized group of acquisition parameters. The method then proceeds by acquiring waveform data using the optimized group of acquisition parameters, and displaying the waveform data acquired using the optimized group of acquisition parameters.

2 Claims, 2 Drawing Sheets

OSCILLOSCOPE WITH SIMPLIFIED SETUP PROCEDURE, AND PROCEDURE FOR SETTING UP OSCILLOSCOPE

BACKGROUND OF THE INVENTION

This invention relates to an oscilloscope with a simplified setup procedure and to a procedure for setting up an oscilloscope.

An oscilloscope can be used to display a waveform representing change of a first variable as a function of a second variable. It will be convenient in the following discussion to assume from time to time that the first variable is the magnitude of a measured quantity, expressed as a voltage, and that the second variable is time, so that the waveform represents variation in magnitude of the measured quantity as a function of time, but it will be understood that the second variable need not be time or even related to time. Typically, the oscilloscope displays a segment of the waveform during an interval containing an occurrence of a trigger event such as a zero crossing.

FIG. 1 illustrates in simplified form the architecture of a conventional digital storage oscilloscope. An analog signal under test existing at a test point 2 is applied to an acquisition system 6 through suitable interface circuitry (not shown). The acquisition system 6 includes an analog-to-digital converter (ADC) by which the analog signal is sampled and quantized. The ADC operates continuously, generating a continuous stream of digital data words and the acquisition system divides the stream of digital data words into multiple waveform records by reference to a trigger event, which is specified to the acquisition system by a processor 14. Each linear waveform record represents the time evolution of the signal under test during an acquisition interval. The waveform records are loaded into an acquisition memory 10. The processor combines the several waveform records and employs the composite waveform record to update a display memory 22. The contents of the display memory are employed to generate a waveform display on a raster scan display device 26.

The character of the display is determined by acquisition parameters which are supplied to the acquisition system by the processor 14. The acquisition parameters include the nature of the trigger event, the sampling rate, the magnitude of the conversion range of the ADC and the offset of the conversion range relative to a ground reference. Generally, the acquisition parameters can be set by user controls 18.

Oscilloscopes are frequently used by technicians who are not familiar with the capabilities of the instrument and may find it difficult to adjust the instrument to provide a clear display of the waveform. Some modem oscilloscopes have an AUTOSET function that can be invoked to aid the user in adjusting the acquisition parameters. The AUTOSET function is defined by a rule set which is stored in a program memory 30 associated with the processor 14. When the AUTOSET function is invoked, the processor 14 analyzes the data values stored in the acquisition memory and iteratively adjusts the acquisition parameters so that the length of the waveform record is approximately equal to a few periods of the fundamental frequency of the signal under test and the peak-to-peak amplitude of the displayed waveform nearly fills the screen vertically.

In many cases, the AUTOSET function is an adequate starting point for a measurement operation, but it is seldom that the display provided by the AUTOSET function will reveal signal features in sufficient detail to enable the user to make useful measurements. For example, frequently the waveform will be a nominal square wave as shown in FIG. 2 but the user will not normally want to view a complete cycle of the waveform but will want to view a detail of the waveform, such as the overshoot and ringing on the rising or falling edge, at a higher level of detail than is afforded by the AUTOSET function. Consequently, after invoking the AUTOSET function, the user must make further extensive adjustments in the acquisition parameters to obtain the desired display. In some cases, the user might not be familiar with the optimum procedure for arriving at the optimum set-up for displaying a signal feature of interest.

SUMMARY OF THE INVENTION

In accordance with a first aspect of the invention there is provided a method of operating an oscilloscope comprising (a) acquiring waveform data using a group of default acquisition parameters, (b) selecting one of a plurality of rule sets for analyzing the acquired waveform data, (c) analyzing the acquired waveform data in accordance with the selected rule set and deriving an optimized group of acquisition parameters, (d) acquiring waveform data using the optimized group of acquisition parameters, and (e) displaying the waveform data acquired using the optimized group of acquisition parameters.

In accordance with a second aspect of the invention there is provided a method of operating an oscilloscope comprising (a) acquiring waveform data using a group of default acquisition parameters, (b) analyzing the acquired waveform data using at least two rule sets and deriving at least two groups of optimized acquisition parameters, based on the rule sets respectively, (c) acquiring waveform data using the groups of optimized acquisition parameters derived in step (b), (d) separately displaying the waveform data acquired in step (c) using the respective groups of optimized acquisition parameters, (e) selecting one of the groups of optimized acquisition parameters based on the display provided in step (d), (f) acquiring waveform data using the selected group of acquisition parameters, and (g) displaying the waveform data acquired using the selected group of acquisition parameters.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
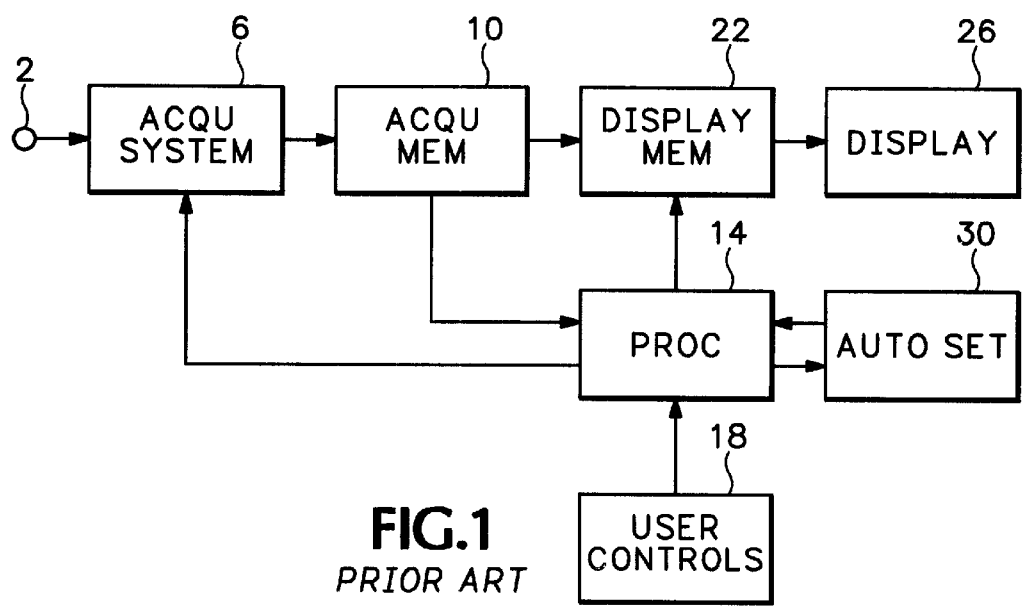
FIG. 1 is a simplified block diagram of a conventional digital storage oscilloscope.
Figure 2:
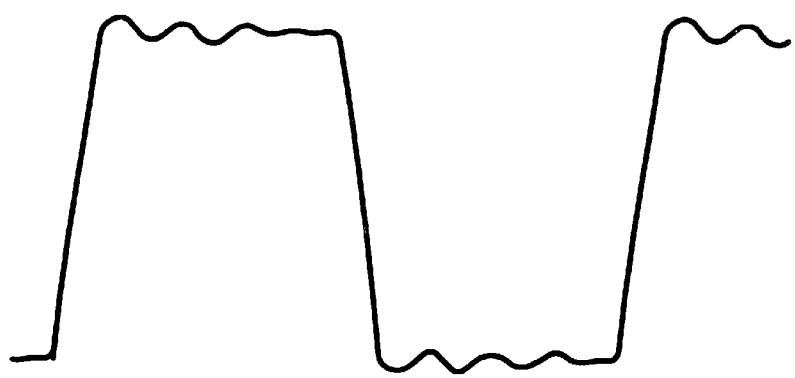
FIG. 2 illustrates the waveform of a typical signal under test.
Figure 3:
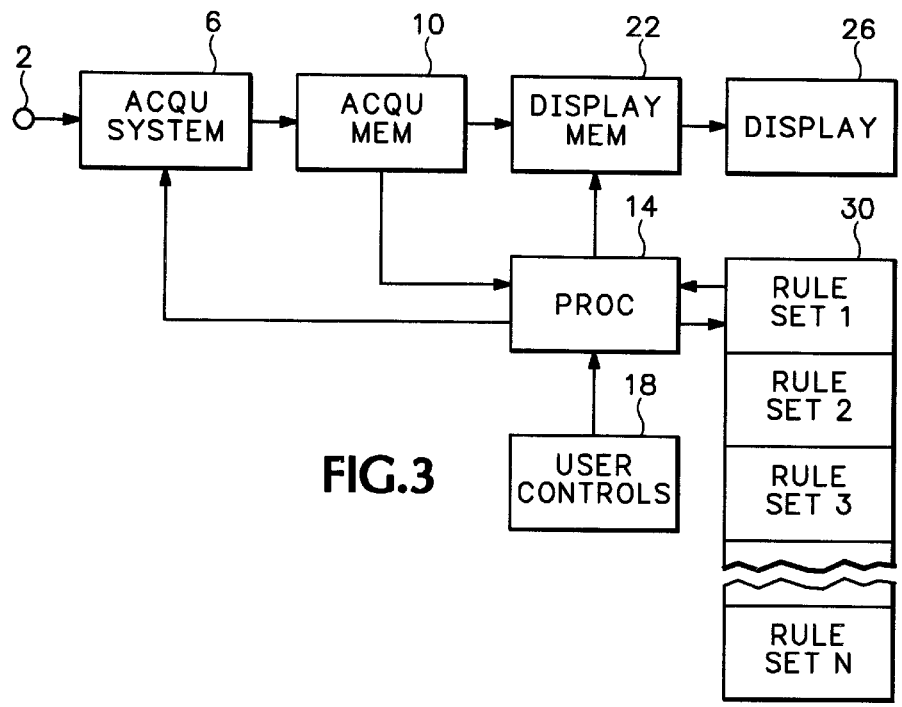
FIG. 3 is a simplified block diagram of a digital storage oscilloscope in accordance with the present invention.

As shown in FIG. 3, the overall architecture of an oscilloscope in accordance with the invention is similar to that of the oscilloscope shown in FIG. 1 except that the program memory 30 stores several rule sets. The rule sets correspond to respective waveform features or standard displays and each rule set defines a procedure for adjusting the acquisition parameters so that the corresponding waveform feature is displayed at a fairly high level of detail. The user controls 18 allow the user to select a particular waveform feature and thereby invoke the corresponding rule set. When the selected waveform feature is displayed, the user need make only minor adjustments in the acquisition parameters to view a detail of the feature.

In one case, for general purpose troubleshooting, the waveform features might include positive-going zero crossing and positive peak. Accordingly, one rule set would be designed to optimize the acquisition parameters for displaying the positive-going zero crossing of the signal waveform and another rule set would be designed to optimize the acquisition parameters for displaying the positive peak. In another case, the user might be presented with a choice of market specific displays. For example, for testing television equipment, one waveform feature might be the color burst and another waveform feature might be the sync pulse.

There are several possible user interfaces to allow selection of a particular rule set. For example, in accordance with one possibility, the rule sets are organized as a linear sequence and the oscilloscope has an AUTOSET button and a RESET button. If the RESET button is pressed and then the AUTOSET button is pressed, the standard AUTOSET function is invoked. Successive activations of the AUTOSET button cause the processor to advance sequentially through the rule sets. On each press of the AUTOSET button, the processor automatically selects the appropriate rule set, adjusts the acquisition parameters and updates the contents of the waveform memory accordingly. When the user reaches the rule set that selects the waveform segment of interest, he can manually adjust the acquisition parameters to display the feature of interest in optimum fashion. Alternatively, the rule sets may be organized as a menu tree composed of several branch menus, such as general purpose troubleshooting and television test, and successive iterations of a first front panel action step through the menu branches in succession, the user selects a desired menu branch by a second front panel action, and then successive iterations of the first front panel action advance sequentially through the rule sets in the selected menu branch.

Figure 4:
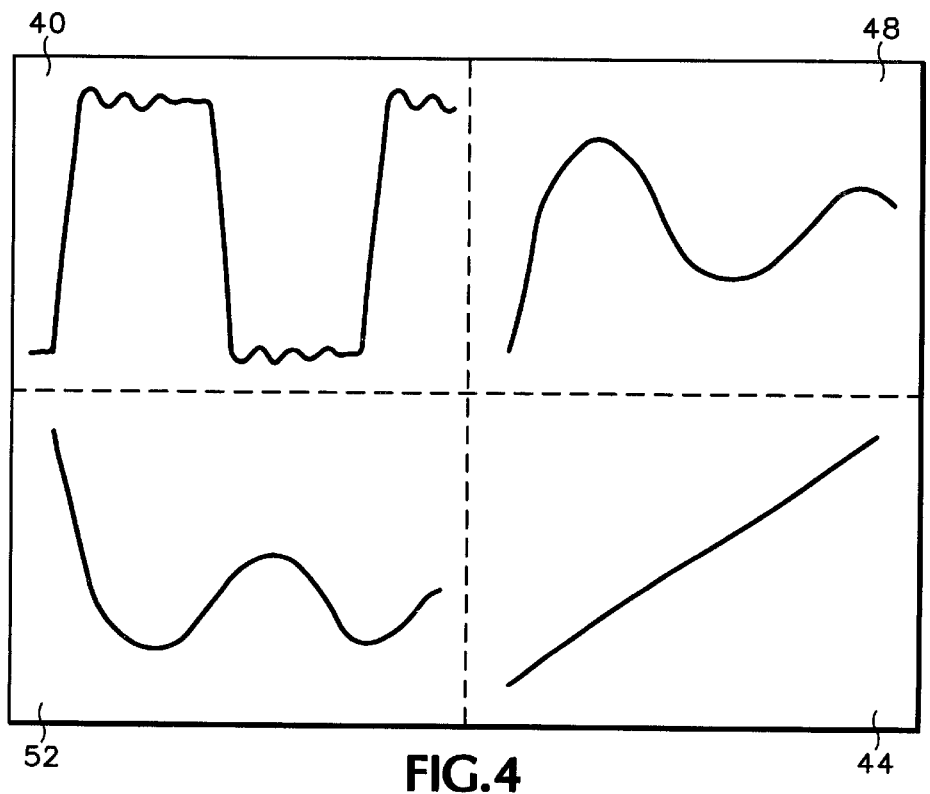
FIG. 4 is a simplified representation of the display provided by an oscilloscope in accordance with the present invention.

Another way of allowing the user to select a particular rule set would be to divide the display screen into multiple tiles and display, in each tile, the result of application of one of the rule sets. For example, referring to FIG. 3, the viewable area of the display screen is divided into four tiles. In an initial condition, the processor controls the acquisition system 6 to apply four rule sets repeatedly, creating display data for four waveform segments, and the display data values, typically after decimation, scaling and offset, are supplied to the display memory. The speed with which the acquisitions are made and processed is sufficient to provide apparently simultaneous display of the four waveform segments. In the case of the example illustrated in FIG. 4, the signal is nominally a square wave and tile 40 contains a display of a single period of the waveform, tile 44 contains an enlarged view of the positive going zero crossing, tile 48 shows the overshoot and ringing at the end of the rising edge transition, and tile 52 shows the overshoot and ringing at the end of the falling edge transition. The user can select whichever of the four segments displays the feature of interest to best advantage. Selection may be accomplished by a front panel control knob or button, but it may also be done using a touch screen.

Yet another method for allowing the user to select the appropriate rule set employs icons displayed at the margin of the waveform display area. Each icon is a primitive representation of the type of waveform that would be displayed, e.g. zero crossing or positive peak, and by selecting the icon, e.g. using a touch screen, the selected rule set is invoked.

Icons may also be displayed to allow the user to select different groups of rule sets. One group of rule sets might be general purpose waveform measurement and another might be market specific. By selecting one icon, the oscilloscope changes to the state in which the waveform display area is divided into tiles and each tile displays a segment acquired using one of the rule sets.

It will be appreciated that the invention is not restricted to the particular embodiment that has been described, and that variations may be made therein without departing from the scope of the invention as defined in the appended claims and equivalents thereof.

What is claimed is:

1. A method of operating an oscilloscope comprising:

(a) acquiring waveform data using a group of default acquisition parameters, (b) selecting one of a plurality of rule sets for analyzing the acquired waveform data, (c) analyzing the acquired waveform data in accordance with the selected rule set and deriving an optimized group of acquisition parameters, (d) acquiring waveform data using the optimized group of acquisition parameters, and (e) displaying the waveform data acquired using the optimized group of acquisition parameters;

wherein step (b) comprises:

invoking a first rule set, analyzing the acquired waveform data in accordance with the first rule set and deriving a first group of acquisition parameters, acquiring waveform data using the first group of acquisition parameters, displaying the waveform data acquired using the first group of acquisition parameters, invoking a second rule set, analyzing the acquired waveform data in accordance with the second rule set and deriving a second group of acquisition parameters, acquiring waveform data using the second group of acquisition parameters, displaying the waveform data acquired using the second group of acquisition parameters, and selecting the first rule set or the second rule set based on the displays of the waveform data acquired using the first and second groups of acquisition parameters respectively.

2. A method according to claim 1, wherein the plurality of rule sets are organized as a menu tree composed of at least first and second branch menus and step (b) includes the step of selecting a menu branch and selecting one of the rule sets in the menu branch.

\* \* \* \* \*